United States Patent [19]

Castellino et al.

[11] 4,457,013
[45] Jun. 26, 1984

[54] DIGITAL SPEECH/DATA DISCRIMINATOR FOR TRANSCODING UNIT

[75] Inventors: Paolo Castellino, Turin; Fulvio Rusina, Cirie-Torino, both of Italy

[73] Assignee: Cselt Centro Studi e Laboratori Telecomunicazioni S.p.A., Turin, Italy

[21] Appl. No.: 351,538

[22] Filed: Feb. 23, 1982

[30] Foreign Application Priority Data

Feb. 24, 1981 [IT] Italy ............................ 67251 A/81

[51] Int. Cl.³ ........................................ G10L 1/00
[52] U.S. Cl. ........................... 381/46; 370/83; 381/31
[58] Field of Search ............... 381/29–35, 381/46; 370/83, 118; 375/122

[56] References Cited

U.S. PATENT DOCUMENTS 4,237,552 12/1980 Aikoh et al. ................ 370/83
4,303,803 12/1981 Yatsuzuka ................... 381/31

OTHER PUBLICATIONS

Article by Jean-Pierre Adoul & Daniel Pradelles entitled "On Line Speech/Data-Modem Identifier for Telephone Network", published in 1977 (Hartford, CT) Reports of IC ASSP, pp. 332–335.

Article by Yohtaro Yatsuzuka entitled "A High–Gain DSI–ADPCM System", published in 1979 (Washington, D.C.) Reports of IC ASSP, pp. 436–441.

Primary Examiner—E. S. Matt Kemeny
Attorney, Agent, or Firm—Karl F. Ross

[57] ABSTRACT

A digital transcoding unit receiving incoming PCM-coded speech and data samples to be distributed after selective quantization to different outgoing channels, with fewer quantizing bits assigned to speech samples than to data samples, includes a discriminator distinguishing among speech samples, high-rate data samples and low-rate data samples on the basis of bandwidth and number of zero crossings. Low-rate data samples are directed by the discriminator to outgoing speech channels, rather than data channels, for more efficient transmission-line utilization.

6 Claims, 2 Drawing Figures

DIGITAL SPEECH/DATA DISCRIMINATOR FOR TRANSCODING UNIT

FIELD OF THE INVENTION

Our present invention relates to a telecommunication system in which samples of speech and voice-band-modulated data signals, both encoded in digital (e.g. PCM) form, are passed over a common signal path to a transcoding unit serving to distribute them with selective quantization to different outgoing channels.

BACKGROUND OF THE INVENTION

Systems for the joint transmission of PCM-coded speech and voice-band-data signals, designed to make more communication channels available on a particular signal path without increasing the bit rate, are well known. These includes the ADPCM (Adaptive Differential PCM) and ADM (Adaptive Delta Modulation) systems, using differential coding, as well as the DSI (Digital Speech Interpolation) system in which available communication channels are assigned only to active speakers. Such techniques enable an approximate doubling of the communication capacity.

There has also been proposed a hybrid system purporting to increase that capacity up to seven times, as described in a paper titled "A High-Gain DSI-ADPCM System" by Yohtaro Yatsuzuka, presented at the 1979 International Conference on Acoustics, Speech and Signal Processing (IC ASSP) in Washington, D.C. According to that system, 5 bits are used for data quantizing whereas 3 and 4 quantizing bits suffice for the coding of voiced and unvoiced sounds, respectively. Various criteria, such as peak energy and number of zero crossings, may be utilized for distinguishing among the different kinds of signals. Reference to this connection may also be made to a paper titled "On-Line Speech-/Data-Modem Identifier for Telephone Network" by Jean-Pierre Adoul and Daniel Pradelles, presented 1977 at IC ASSP in Hartford, Connecticut; the criteria described there further include the average logarithmic magnitude in a block of 64 PCM samples, extending over an interval of 8 ms, and the number of sign changes between consecutive samples of different magnitudes. According to the authors of the latter report, however, the classification based on these parameters is not infallible and is particularly difficult for unvoiced sounds such as "sh".

If a classification error in such a system causes speech samples to be treated as data samples, the resulting increase in the number of quantizing bits needlessly reduces the number of available channels. Conversely, an assignment of data samples to a speech block with suppression of seemingly redundant bits will introduce a phase shift which, especially when data transmission is by phase-shift keying (PSK, see for example commonly owned U.S. Pat. No. 3,914,695), may be objectionable or totally unacceptable. With low-rate data transmission, e.g. up to 2400 data bits per second, the phase error may be inconsequential; at, say, 4800 bits per second it would generally be intolerable. Moreover, conventional phase discriminators may cause such an error to perpetuate itself throughout the entire message.

OBJECT OF THE INVENTION

The object of our present invention, therefore, is to provide means in a transcoding unit receiving digitized speech and voice-band data samples for discriminating among these samples in a most expeditious way calculated to optimize channel capacity while minimizing the consequences of possible classification errors.

SUMMARY OF THE INVENTION

A digital discriminator according to our invention, having an input stage connected to an incoming signal path in parallel with first quantization means using a lower number of quantizing bits and second quantization means using a higher number of such bits for each outgoing sample, comprises a first and a second transversal filter as well as a digital low-pass filter all connected to the input stage, the transfer functions of the first and second transversal filters being equal to the reciprocal of the mean bandwidth of incoming speech and data signals, respectively. With such inverse filtering, as is well known, the maximum ratio of output to input power occurs for the signal which the filter is intended to favor, i.e. speech in the first and data in the second instance. The three filters are respectively connected to a first, a second and a third digital integrator, serving to average or otherwise accumulate their output signals over a predetermined evaluation period such as the block interval of 8 ms referred to above, which in turn are connected to arithmetic means determining from their contents a probable classification of incoming samples as speech, high-rate data or low-rate data samples. An enabling input of the first quantization means is connected to the arithmetic means for activation in the presence of probable speech and low-rate data samples whereas an enabling input of the second quantization means is similarly activable by the arithmetic means only in the presence of probable high-rate data samples; the high-rate data samples will therefore have more quantizing bits allotted to them than either the speech or the low-rate data samples.

According to another feature of our invention, the discriminator further comprises a fourth integrator connected to the input stage in parallel with the aforementioned filters for accumulating the magnitudes of all incoming samples over each evaluation period. Two dividers, forming part of the arithmetic means, are connected to this fourth integrator, the first of these dividers being also connected to the first integrator for establishing a first ratio representing a presumed proportion of speech signals while the second divider is also connected to the second integrator for establishing a second ratio representing a presumed proportion of data signals. Two comparators with inputs connected to respective sources of reference value may likewise be included in the arithmetic means, namely a level comparator receiving the output of the third integrator and a numerical comparator coupled through a fifth integrator to the output of a zero-crossing detector for registering the number of sign changes during an evaluation period. The two dividers and the two comparators have output connections to logical circuitry of the arithmetic means for generating a speech indication whenever the first ratio exceeds the second ratio in the presence of a low-number signal from the numerical comparator and for generating a data indication whenever the second ratio exceeds the first ratio in the presence of a high-number signal from that comparator, the second quantization means being activated by the logical circuitry in response to a coincidence of a data indication with a high-level signal from the level comparator.

BRIEF DESCRIPTION OF THE DRAWING

The above and other features of our invention will now be described in detail with reference to the accompanying drawing in which.

SPECIFIC DESCRIPTION

Figure 1:
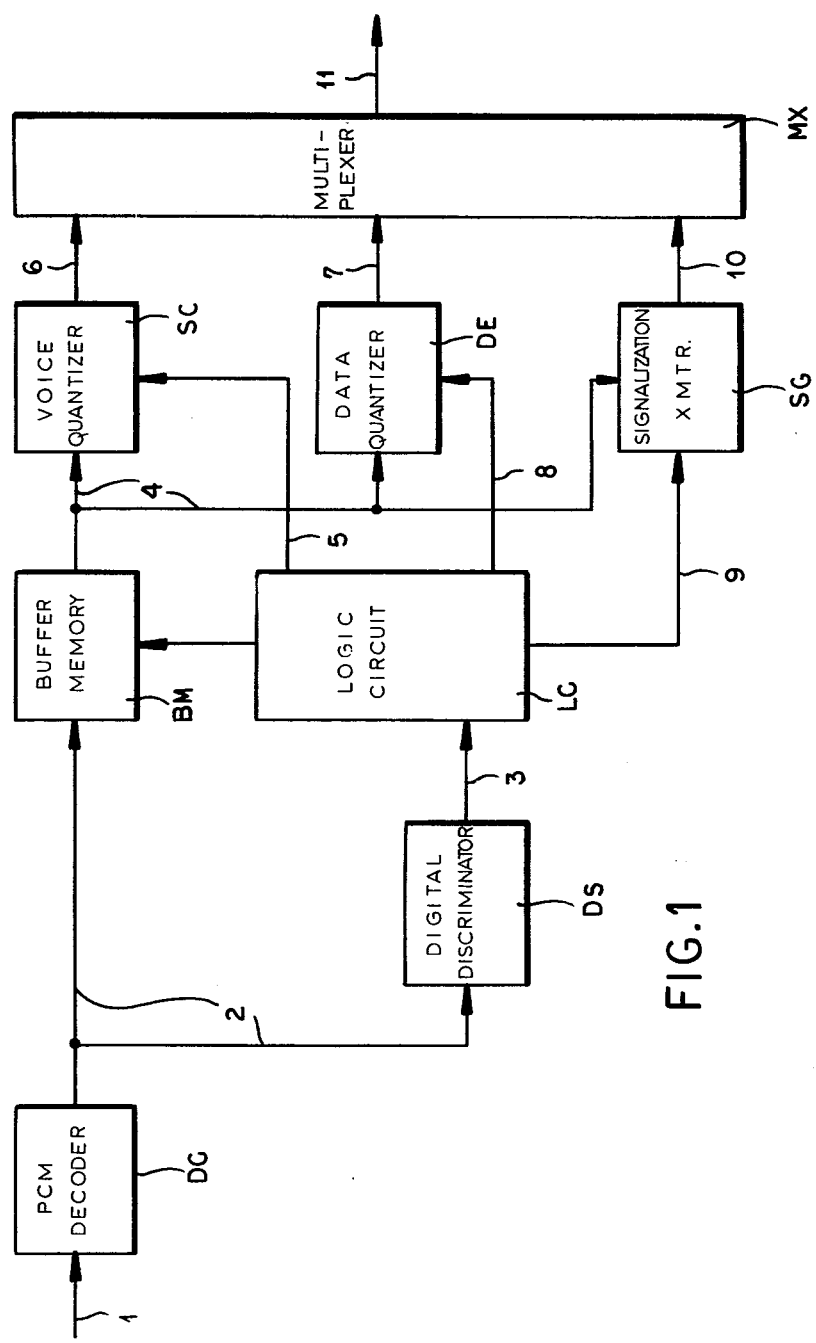
FIG. 1 is a block diagram of a transcoding unit embodying a digital discriminator according to our invention.

The transcoder of FIG. 1 comprises a unit DC connected to an incoming signal path 1 which is part of a telecommunication system and carries speech signals alternating with data signals modulated upon a voice-frequency carrier of, say, 1800 Hz by 4-phase DPSK (differential phase-shift keying). If the incoming signals are in analog form, unit DC acts as an analog/digital converter; if they are in the form of PCM frames, this unit operates as a decoder and linearizer. In either case, therefore, a linear bit stream will be emitted by unit DC on an output lead 2 thereof which extends on the one hand to a buffer memory BM and on the other hand to a digital discriminator DS according to our invention.

Figure 2:
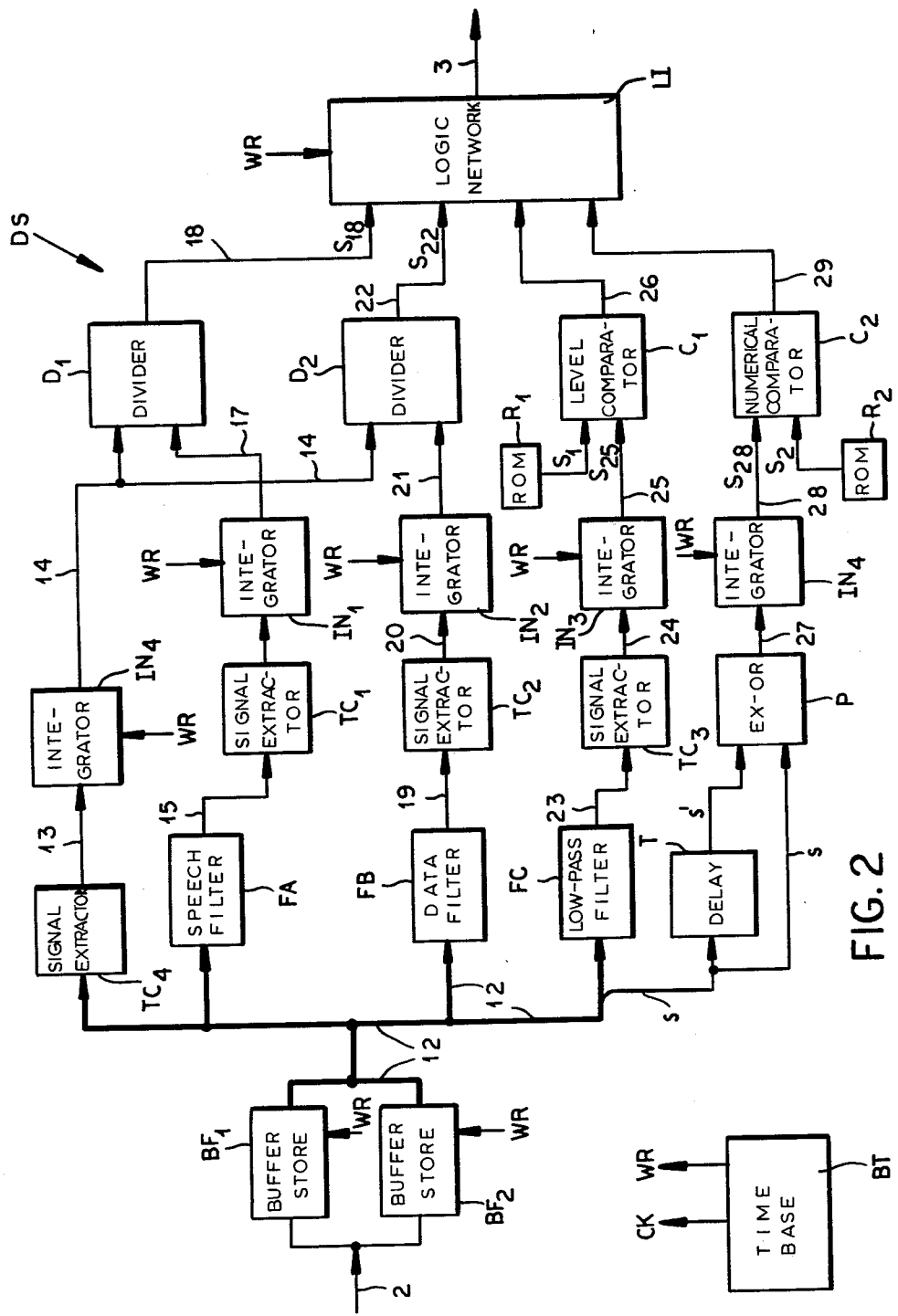
FIG. 2 shows details of the discriminator of FIG. 1.

Discriminator DS, via a connection 3, controls a logic circuit LC which sends operating instructions to other components of the transcoder shown in FIG. 1, namely to buffer memory BM, to a voice quantizer or coder SC and to a data quantizer or coder DE. These two coders are alternatively activated, as more fully described hereinafter, via respective leads 5 and 8 to process the PCM samples periodically read out from buffer memory BM upon the command of logic circuit LC. Supervisory information present in the bit stream on lead 2 is fed, during certain time slots of an outgoing frame, to a signalization transmitter SG in response to commands on another output lead 9 of logic circuit LC which are generated by a time base BT (FIG. 2); the operation of this signalization transmitter is entirely conventional and not relevant to our invention. Components SC, DE and SG are connected via respective leads 6, 7 and 10 to corresponding inputs of a multiplexer MX which is switched by the aforementioned time base to deliver their contents to a transmission line 11 in different time slots of an outgoing frame. Coder SG may operate with variable quantization, e. g. with 3 or 4 bits for voiced and unvoiced phonemes as described in the Yatsuzuka article, while coder DE uses 5 bits for quantizing high-speed data.

According to the usual practice, a fixed number of time slots allocated to outgoing channels—about 30% of those available—would be assigned to data-signal transmission while the remainder, aside from those used for signalization, would be reserved for speech signals. Such a fixed distribution ratio constitutes an inefficient utilization of communication capacity and is therefore replaced, in accordance with our invention, by a flexible mode of channel assignment under the control of discriminator DS as will now be described with reference to FIG. 2.

The branch of lead 2 extending to discriminator DS terminates at an input stage thereof constituted by two parallel buffer stores $BF_1$, $BF_2$ which are alternately loaded with blocks of incoming PCM samples or bytes, during successive evaluation periods of 8 ms, by writing commands WR emitted from time base BT and whose contents are alternately read out, upon the disappearance of these writing commands, to a multiple 12 with eight leads of which seven are connected in parallel to a transversal speech filter FA, a similar data filter FB, a digital low-pass filter FC and a signal extractor $TC_4$ of the true-complement type restoring the magnitudes of the DPSK-coded samples in a manner well known per se. Similar signal extractors $TC_1$, $TC_2$ and $TC_3$ are connected via respective leads 15, 19 and 23 to the outputs of filters FA, FB and FC. Extractors $TC_1$, $TC_2$, $TC_3$ and $TC_4$ work, by way of respective leads 16, 20, 24 and 13, into associated digital integrators $IN_1$, $IN_2$, $IN_3$ and $IN_4$ which are timed by commands WR to average the incoming samples over the aforementioned evaluation period of 8 ms. The writing and integrating commands WR, measuring this evaluation period, as well as clock pulses CK, fed to all the digital components of the discriminator, are generated by time base BT in response to the PCM sampling frequency or frame period of 125 $\mu$s extracted from the arriving bit stream.

The eighth lead s of multiple 12 is connected to a one-cell data store T delaying by one sampling interval of 4 $\mu$s, corresponding to a cycle of clock pulses CK, an incoming sign bit appearing on that lead. An output lead s' of data store T extends, together with an extension of lead s, to an Exclusive-OR gate P which emits a pulse on a lead 27 whenever the bits on leads s and s' do not coincide, i.e. when a zero crossing has occurred between two consecutive bytes. An integrator or pulse counter $IN_5$ connected to lead 27 sums the output pulses of EX-OR gate P so as to provide a signal proportional to the number of sign changes or zero crossings occurring during an evaluation period.

An output lead 14 of integrator $IN_4$ is connected in parallel to respective inputs of two digital dividers $D_1$, $D_2$ each having another input respectively connected to an output lead 17 or 20 of integrator $IN_1$ or $IN_2$. Divider $D_1$ delivers via a lead 18 to a logic network LI, also driven by timing command WR, a signal $S_{18}$ representing the ratio of the average value of the samples passed by filter FA to the corresponding value of all the samples obtained from the incoming bit stream by means of extractor $TC_4$; analogously, a ratio pertaining to the average values of the samples passed by filter FB to that of all the extracted samples is fed by divider $D_2$ as a signal $S_{22}$ on a lead 22 to logic network LI.

Integrator $IN_3$ has an output lead 25 delivering a signal $S_{25}$ to one input of a level comparator $C_1$ whose other input receives a constant reference value $S_1$, e.g. 40, from a source $R_1$ designed as a read-only memory. A similar source $R_2$ delivers a reference value $S_2$, e.g. 12, to an input of a numerical comparator $C_2$ whose other input receives on a lead 28 a signal $S_{28}$ representing the number of zero crossings established by integrator $IN_5$. The two comparators $C_1$ and $C_2$ have respective output leads 26 and 29 terminating at logic network LI whose output is the connection 3 extending to logic circuit LC of FIG. 1.

From the foregoing discussion it will be apparent that a relationship $S_{18} > S_{22}$ indicates a likelihood that the samples picked up during the immediately preceding evaluation period (and currently stored in buffer memory BM of FIG. 1) represent speech signals rather than data signals. In such an event, moreover, the number of zero crossings should be relatively low, i.e. $S_{28} < S_2$. Thus, logic network LI emits on connection 3 an instruction classifying the contents of buffer memory BM as speech signals, to be routed to coder SC, if $$[S_{18} > S_{22}] \cdot [S_{28} < S_2] = 1 \tag{1}$$

The presence of voice-band-modulated data, on the other hand, is likely when the opposite relationship is found to be true, i.e. when $$[S_{18} < S_{22}] \cdot [S_{22} > S_2] = 1 \tag{2}$$

In this latter instance, however, it behooves to determine whether the presumed data are of the low-rate or the high-rate type. The output signal of low-pass filter FC, which may have a cutoff frequency of about 900 Hz, will have a higher average when the incoming signal has a larger bandwidth indicative of rapidly recurring data bits; thus, level comparator $C_1$ is able to distinguish between low-rate data signals up to, say, 2400 bits per second and high-rate data signals of, say, 3600 or 4800 bits per second. Only when $S_{25} < S_1$, as determined by the output signal of this comparator on lead 26, will logic network LI emit an instruction causing the routing of the contents of memory BM to coder DE if equation (2) is simultaneously satisfied; if the latter equation coincides with the condition $S_{25} < S_1$, the received samples are treated as speech signals.

If neither one of equations (1) and (2) is fulfilled, logic network LI will maintain the routing instructions emitted during the preceding evaluation period.

We claim:

1. In a transcoding unit of a telecommunication system including circuit means for respectively directing digitized samples of speech signals and of voice-band-modulated data signals from an incoming signal path to first quantization means using a lower number of quantizing bits and to second quantization means using a higher number of quantizing bits for each outgoing sample, said coders having outputs switchable to an outgoing transmission line, the combination therewith of a digital discriminator with an input stage connected to said signal path for receiving said samples in parallel with said first and second quantization means, said discriminator comprising:

a first transversal filter connected to said input stage with a transfer function equal to the reciprocal of the mean bandwidth of incoming speech signals;

a second transverse filter connected to said input stage with a transfer function equal to the reciprocal of the mean bandwidth of incoming data signals;

a digital low-pass filter connected to said input stage;

first, second and third integrating means respectively connected to said first transversal filter, said second transversal filter and said low-pass filter for accumulating output signals thereof over a predetermined evaluation period; and arithmetic means connected to said first, second and third integrating means for determining from the contents thereof a probable classification of incoming samples as speech samples, high-rate data samples or low-rate data samples;

said first quantization means having an enabling input connected to said arithmetic means for activation in the presence of probable speech and low-rate data samples, said second quantization means having an enabling input connected to said arithmetic means for activation only in the presence of probable high-rate data samples.

2. The combination defined in claim 1 wherein said input stage comprises two parallel buffer stores alternately written and read during successive evaluation periods.

3. The combination defined in claim 1 or 2 wherein said discriminator further comprises fourth integrating means connected to said input stage in parallel with said filters for accumulating the magnitudes of incoming samples over said evaluation period, said arithmetic means including a first divider connected to said first and said fourth integrating means for establishing a first ratio representing a presumed proportion of speech signals, a second divider connected to said second and said fourth integrating means for establishing a second ratio representing a presumed proportion of data signals, and a level comparator with inputs connected to said third integrating means and to a source of reference value.

4. The combination defined in claim 3 wherein said discriminator further comprises a zero-crossing detector and fifth integrating means connected to said detector, said arithmetic means further including a numerical comparator with inputs connected to said fifth integrating means and to another source of reference value.

5. The combination defined in claim 4 wherein said arithmetic means further includes logical circuitry connected to said dividers and to said comparators for generating a speech indication whenever said first ratio exceeds said second ratio in the presence of a low-number signal from said numerical comparator and for generating a data indication whenever said second ratio exceeds said first ratio in the presence of a high-number signal from said nunerical comparator, said second quantization means being activated by said logical circuitry upon coincidence of said data indication with a high-level signal from said level comparator.

6. The combination defined in claim 4 wherein said zero-crossing detector comprises an Exclusive-OR gate with a first input receiving an undelayed sign bit and with a second input receiving a sign bit delayed by one sampling interval.

* * * * *